(12) United States Patent
Wang

(10) Patent No.: US 10,620,768 B2
(45) Date of Patent: Apr. 14, 2020

(54) FLEXIBLE DISPLAY PANEL, MANUFACTURING METHOD THEREOF AND DISPLAY DEVICE

(71) Applicant: BOE TECHNOLOGY GROUP CO., LTD., Beijing (CN)

(72) Inventor: Ming-Hsi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 164 days.

(21) Appl. No.: 15/745,817

(22) PCT Filed: Jul. 6, 2017

(86) PCT No.: PCT/CN2017/091987
§ 371 (c)(1),
(2) Date: Jan. 18, 2018

(87) PCT Pub. No.: WO2018/040735
PCT Pub. Date: Mar. 8, 2018

(65) Prior Publication Data
US 2019/0346972 A1 Nov. 14, 2019

(30) Foreign Application Priority Data

Sep. 5, 2016 (CN) .......................... 2016 1 0802185

(51) Int. Cl.
*G06F 3/044* (2006.01)
*H01L 27/32* (2006.01)

(52) U.S. Cl.
CPC .......... *G06F 3/0446* (2019.05); *G06F 3/0443* (2019.05); *G06F 2203/04102* (2013.01);
(Continued)

(58) Field of Classification Search
None
See application file for complete search history.

(56) References Cited

U.S. PATENT DOCUMENTS

2016/0372713 A1    12/2016   Wang et al.

FOREIGN PATENT DOCUMENTS

CN         101059575 A      10/2007
CN         103682156 A       3/2014
(Continued)

OTHER PUBLICATIONS

Search Report for International Application No. PCT/CN2017/091987 dated Sep. 27, 2017.

*Primary Examiner* — Nicholas J Lee
(74) *Attorney, Agent, or Firm* — Calfee, Halter & Griswold LLP

(57) ABSTRACT

A flexible display panel includes: a plurality of display units provided on a flexible substrate, a packaging film provided on each of the display units, and a color film layer for anti-reflection provided on the packaging film, wherein the color film layer comprises: a plurality of colored light filtering layers provided corresponding to each of the display units and light shielding layers provided at gaps between each of the colored light filtering layers. By replacing an externally bonded polarizer with a color film layer, the light transmittance of a colored light filtering layer in the color film layer is higher than that of the polarizer, and a light shielding layer in the color film layer may block reflection of a light-reflective element provided at the gap between the display units to the ambient light.

20 Claims, 4 Drawing Sheets

(52) U.S. Cl.
CPC .............. *G06F 2203/04103* (2013.01); *G06F 2203/04112* (2013.01); *H01L 27/322* (2013.01); *H01L 27/323* (2013.01)

(56) References Cited

FOREIGN PATENT DOCUMENTS

| | | | |
|---|---|---|---|
| CN | 106157818 | A | 11/2016 |
| CN | 206021808 | U | 3/2017 |
| JP | 2014006353 | A | 1/2014 |
| JP | 2016109929 | A | 6/2016 |

FLEXIBLE DISPLAY PANEL, MANUFACTURING METHOD THEREOF AND DISPLAY DEVICE

CROSS-REFERENCES TO RELATED APPLICATIONS

The present application is based on International Application No. PCT/CN2017/091987, filed on Jul. 6, 2017, which is based upon and claims priority to Chinese Patent Application No. 201610802185.7, titled "FLEXIBLE DISPLAY PANEL, MANUFACTURING METHOD THEREOF AND DISPLAY DEVICE", filed on Sep. 5, 2016, and the entire contents thereof are incorporated herein by reference.

TECHNICAL FIELD

The present disclosure relates to the field of display technology, and more particularly, to a flexible display panel, a manufacturing method thereof and a display device.

BACKGROUND

According to flexible display technology mainly adopting flexible electronic technology, mount flexible display media electronic elements and materials are mounted on a flexible substrate or bendable substrate, such that the display has the ability to be bent or curled in any shape, and possess characteristics of lightness, thinness and being easy to carry or the like.

At present, in order to prevent the display quality from being degraded due that elements in the flexible display panel reflects ambient light, a polarizer having an anti-reflection function is generally required to be externally bonded on the flexible display panel to ensure the display quality. However, the polarizer may cause some loss of the emergent light of the flexible display panel, and reduce the display brightness of the flexible display panel. In addition, the polarizer generally has large thickness, which is unfavorable to the bending of the flexible display panel.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a flexible display panel, including: a plurality of display units provided on a flexible substrate, a packaging film provided on each of the display units, and a color film layer for anti-reflection provided on the packaging film, wherein the color film layer includes: a plurality of colored light filtering layers provided corresponding to each of the display units and light shielding layers provided at gaps between each of the colored light filtering layers.

In one possible implementation, the above flexible display panel provided by the embodiments of the present disclosure further includes: a touch detection structure provided on the packaging film, wherein a pattern of the touch detection structure is located in a region where the light shielding layer is located.

In one possible implementation, in the above flexible display panel provided by the embodiments of the present disclosure, the touch detection structure includes a plurality of metal mesh touch detection electrodes.

In one possible implementation, in the above flexible display panel provided by the embodiments of the present disclosure, each of the metal mesh touch detection electrodes is provided in the same layer and arranged in an array.

In one possible implementation, in the above flexible display panel provided by the embodiments of the present disclosure, each of the metal mesh touch detection electrodes is provided between the light shielding layer and the packaging film; or, each of the metal mesh touch detection electrodes is provided above the light shielding layer.

In one possible implementation, in the above flexible display panel provided by the embodiments of the present disclosure, each of the metal mesh touch detection electrodes includes a plurality of touch electrodes extending along a first direction between the light shielding layer and the packaging film, and a plurality of touch electrodes extending along a second direction above the light shielding layer.

In one possible implementation, in the above flexible display panel provided by the embodiments of the present disclosure, each of the touch detection electrodes extending along the first direction is a touch driving electrode, and each of the touch detection electrodes extending along the second direction is a touch sensing electrode; or, each of the touch detection electrodes extending along the first direction is a touch sensing electrode, and each of the touch detection electrodes extending along the second direction is a touch driving electrode.

In one possible implementation, in the above flexible display panel provided by the embodiments of the present disclosure, each of the colored light filtering layers has a color identical to a color displayed by each of the corresponding display units.

In one possible implementation, in the above flexible display panel provided by the embodiments of the present disclosure, a shape of each of the colored light filtering layers has a shape identical to a shape of each of the corresponding display units, and an orthographic projection of each of the colored light filtering layers on the packaging film overlap overlaps with and an orthographic projection of each of the corresponding display units on the packaging film.

In one possible implementation, in the above flexible display panel provided by the embodiments of the present disclosure, each of the display units is repeated by a rhombus constituted by two symmetrical green pentagonal light emitting units, one blue hexagonal light emitting unit and one red hexagonal light emitting unit, wherein an area occupied by the blue hexagonal light emitting unit is larger than an area occupied by the red hexagonal light emitting unit.

In another aspect, the embodiments of the present disclosure further provide a display device, including the above flexible display panels provided by the embodiments of the present disclosure.

In another aspect, the embodiments of the present disclosure further provide a method for manufacturing the above flexible display panels provided by the embodiments of the present disclosure, including:

forming a plurality of display units on a flexible substrate;

forming a packaging film on each of the display units; and forming a color film layer for anti-reflection on the packaging film, wherein the color film layer includes a plurality of colored light filtering layers provided corresponding to each of the display units and light shielding layers provided at gaps between each of the colored light filtering layers.

In one possible implementation, the above manufacturing method provided by the embodiments of the present disclosure further includes: forming a touch detection structure on the packaging film, a pattern of the touch detection structure being located in a region where the light shielding layer is located.

In one possible implementation, in the above manufacturing method provided by the embodiments of the present, the forming a color film layer for anti-reflection and a touch detection structure on the packaging film includes:

forming a plurality of metal mesh touch detection electrodes on the packaging film; and sequentially forming the light shielding layer and the color film layer on each of the metal mesh touch detection electrodes; or sequentially forming the light shielding layer and the color film layer on the packaging film; and forming a plurality of metal mesh touch detection electrodes on the light shielding layer.

In one possible implementation, in the above manufacturing method provided by the embodiments of the present disclosure, the forming a color film layer for anti-reflection and a touch detection structure on the packaging film includes:

forming a plurality of touch electrodes extending along a first direction on the packaging film;

sequentially forming the light shielding layer and the color film layer on each of the touch electrodes extending along the first direction; and forming a plurality of touch electrodes extending along a second direction on the light shielding layer.

DETAILED DESCRIPTION

Figure 1:
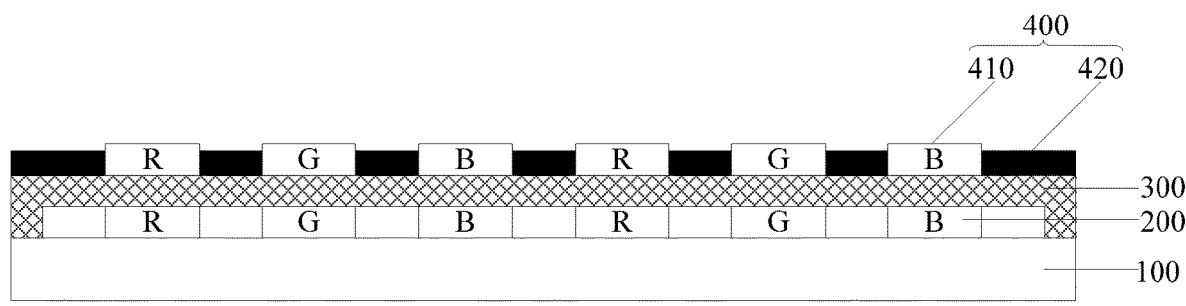
FIG. 1 is a schematic structural view of a flexible display panel provided by an embodiment of the present disclosure.

A flexible display panel, a manufacturing method thereof and a display device provided by embodiments of the present disclosure will be described in detail below with reference to the accompanying drawings.

The shapes and sizes of the parts in the drawings do not necessarily reflect the true scale of the flexible display panel, which is merely for the purpose of illustrating contents of the present disclosure.

The embodiment of the present disclosure provides a flexible display panel, as shown in FIG. 1, including: a plurality of display units 200 provided on a flexible substrate 100, a packaging film 300 provided on each of the display units 200, and a color film layer 400 for anti-reflection provided on the packaging film 300.

In the embodiment, the color film layer 400 includes: a plurality of colored light filtering layers 410 provided by the way that each of the colored light filtering layers 410 corresponds to each of the display units 200, and light shielding layers 420 provided at gaps between each of the colored light filtering layers 410.

In the above flexible display panel provided by the embodiment of the present disclosure, by replacing an externally bonded polarizer with a color film layer 400, the light transmittance of a colored light filtering layer 410 in the color film layer 400 is higher than that of the polarizer, and a light shielding layer 420 in the color film layer 400 may block a light-reflective element provided at the gap between the display units 200 from reflecting the ambient light. In this way, the anti-reflection function of the flexible display panel may be achieved, and meanwhile it may ensure that the flexible display panel has excellent display brightness. In addition, a thickness of the color film layer 400 is smaller than that of the conventional polarizer, which facilitates the bending of the flexible display panel.

In specific implementation, in the above flexible display panel provided by the embodiments of the present disclosure, in order to achieve flexible display, the display unit 200 is generally implemented by using an organic electroluminescent device. Since the color film layer 400 having the anti-reflection function includes a colored light filtering layer 410, each of the display units 200 may be an organic electroluminescent display device which emits white light, or may also be an organic electroluminescent display device which emits monochromatic light, such as a red R, green G or blue B organic electroluminescent display devices, which is not limited herein.

In addition, in one embodiment, in order to reduce light loss and reduce power consumption, in the above flexible display panel provided by the embodiments of the present disclosure, an organic electroluminescent display device emitting monochromatic light is generally selected as the display unit 200. In this case, in order to minimize display light loss and improve display brightness, a color of each colored light filtering layer 410 needs to be the same as the color displayed by the corresponding display unit 200. For example, a colored light filtering layer 410 in red R is provided on the display unit 200 displaying red R, and so on.

In one embodiment, in order to reduce light loss and improve display brightness, in the above flexible display panel provided by the embodiments of the present disclosure, as shown in FIG. 1, the shape of each colored light filtering layer 410 generally needs to be the same as that of the corresponding display unit 200, and the orthographic projection of the colored light filtering layer 410 on the packaging film 300 overlaps with that of the corresponding display unit 200 on the packaging film 300. That is, the colored light filtering layers 410 and the display units 200 have the same shape, the same size, and are directly opposite to each other.

Figure 2:
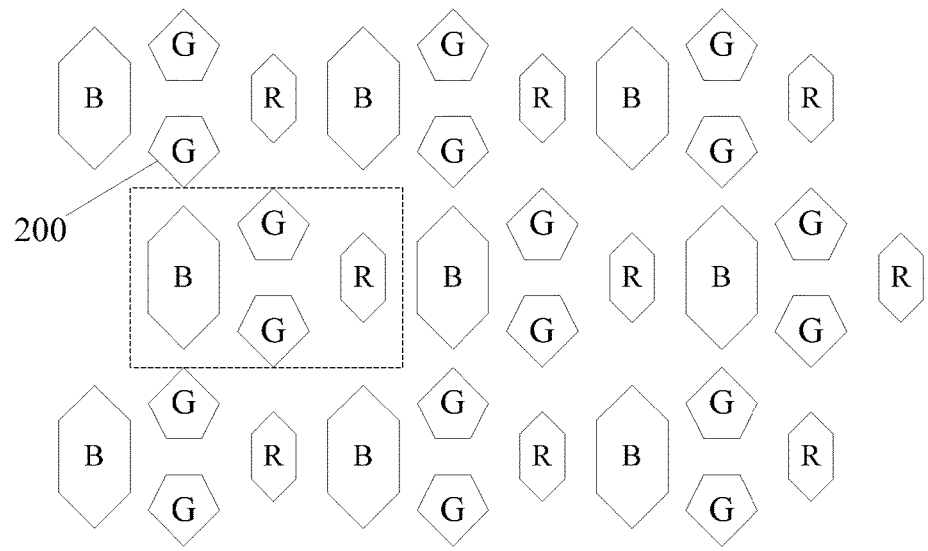
FIG. 2 is a schematic top view of a display unit in a flexible display panel provided by an embodiment of the present disclosure.

During specific implementation, in the above flexible display panel provided by the embodiments of the present disclosure, various arrangement and combination modes of the display units 200 may be designed according to some factors, such as the color to be displayed, the luminous efficiency of the display unit 200 in each color and the like, which will not be exemplified in detail herein. Since the human eye is more sensitive to the green color, and the red color has high luminous efficiency, in one embodiment, in the above flexible display panel provided by the embodiments of the present disclosure, as shown in FIG. 2, each of the display units 200 may be repeated by a rhombus arrangement (as shown in dashed box in FIG. 2) constituted by two symmetrical green G pentagonal light emitting units, one blue B hexagonal light emitting unit and one red R hexagonal light emitting unit, wherein an area occupied by the blue B hexagonal light emitting unit is larger than an area occupied by the red R hexagonal light emitting unit.

During specific implementation, in the above flexible display panel provided by the embodiments of the present disclosure, the light shielding layer 420 may be implemented by using black matrix material.

Figure 3A:
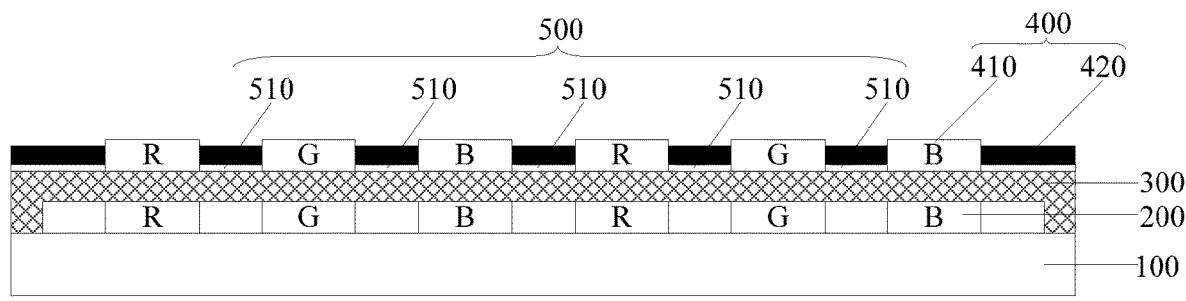
FIGS. 3a to 3c are another structural schematic diagrams of a flexible display panel provided by the embodiments of the present disclosure, respectively.
Figure 3B:
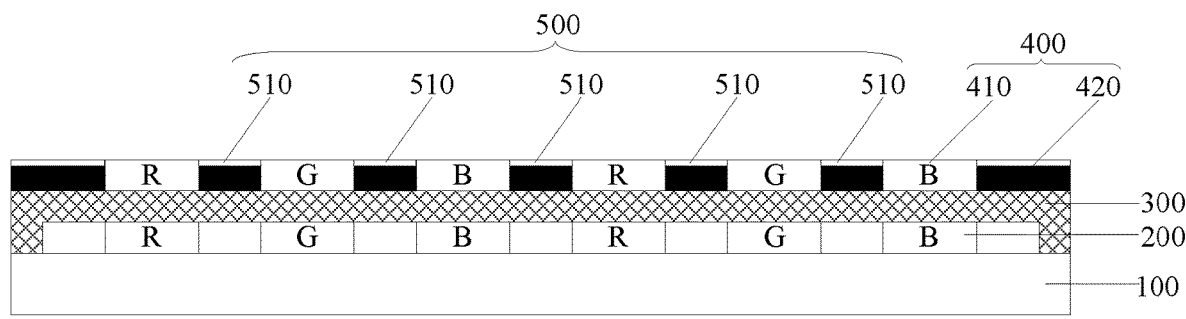
Figure 3C:
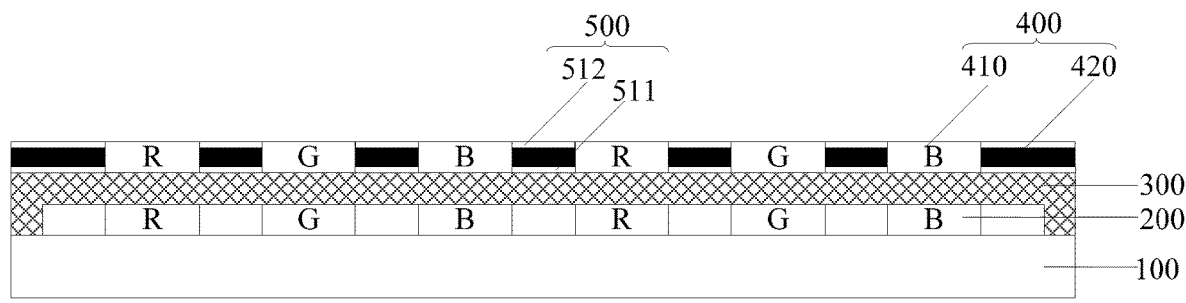

Further, in the above flexible display panel provided by the embodiment of the present disclosure, in order to realize the touch control function, as shown in FIGS. 3a to 3c, the flexible display panel further includes: a touch detection structure 500 provided on the packaging film 300, wherein a pattern of the touch detection structure 500 is located in a region where the light shielding layer 420 is located. Since the pattern layout of the touch detection structure 500 is designed by using the blocking of the light shielding layer 420, the touch control function may be implemented while the normal display is not affected, and the possibility that the pattern of the touch detection structure 500 is viewed may also be reduced.

In one embodiment, in the above flexible display panel provided by the embodiment of the present disclosure, in order to meet the good folding property of the flexible display panel, the touch detection structure 500 may be composed by a plurality of metal mesh touch detection electrodes 510 during specific implementation.

Specifically, in the above flexible display panel provided by the embodiments of the present disclosure, there are two ways to achieve touch detection modes of the metal mesh touch detection electrode 510 of the touch detection structure 500.

The first way: as shown in FIGS. 3a and 3b, each of the metal mesh touch detection electrodes 510 is provided in the same layer and arranged in an array. In this case, each metal mesh touch detection electrode 510 realizes the detection of the touch control position by using self-capacitance principle.

During specific implementation, as shown in FIG. 3a, each of the metal mesh touch detection electrodes 510 may be provided between the light shielding layer 420 and the packaging film 300; or, as shown in FIG. 3b, each of the metal mesh touch detection electrodes 510 may also be provided above the light shielding layer 420.

The second way: as shown in FIG. 3c, each of the metal mesh touch detection electrodes 510 includes a plurality of touch electrodes 511 extending along a first direction between the light shielding layer 420 and the packaging film 300, and a plurality of touch electrodes 512 extending along a second direction above the light shielding layer 420.

In the embodiment, generally, the first direction and the second direction are perpendicular to each other. For example, the first direction is a longitudinal direction and the second direction is a transverse direction.

Specifically, the touch detection electrodes 511 extending along the first direction between the light shielding layer 420 and the packaging film 300 may be the touch driving electrodes Tx, and correspondingly, the touch detection electrodes 512 extending along the second direction above the light shielding layer 420 may be a touch sensing electrode Rx. Alternatively, on the contrary, the touch detection electrodes 511 extending along the first direction may be the touch sensing electrodes Rx, and correspondingly, the touch detection electrodes 512 extending along the second direction may be the touch driving electrodes Tx.

Figure 4:
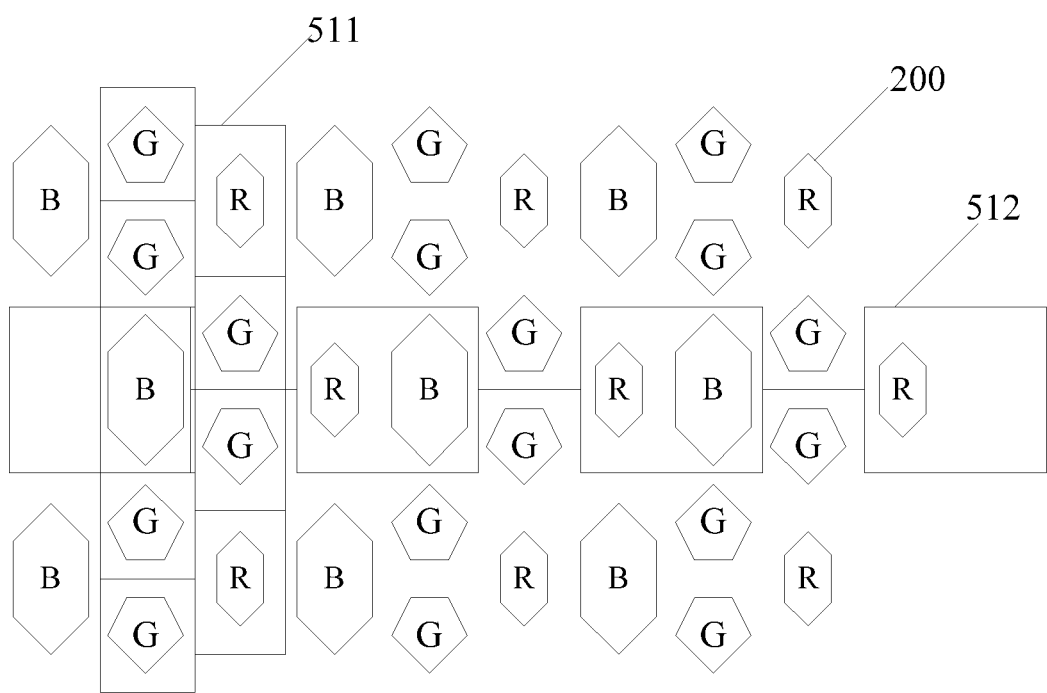
FIG. 4 is a schematic top view of a touch detection structure in a flexible display panel provided by an embodiment of the present disclosure.

During specific implementation, in the above flexible display panel provided by the embodiments of the present disclosure, there may be various pattern distributions of the metal mesh touch detection electrodes 510 that constitute the touch detection structure 500. In the above second way of the touch detection, for example, as shown in FIG. 4, the touch detection electrodes 511 extending along the first direction may be a mesh-shaped structure with each display unit 200 as a mesh opening, and the touch detection electrodes 512 extending along the second direction may be a mesh-shaped structure with two display units 200 as a mesh opening. FIG. 4 only shows an example, and the mesh pattern may not be limited thereto in actual implementation.

Based on the same inventive concept, the embodiments of the present disclosure further provide a display device including the above flexible display panels provided by the embodiments of the present disclosure. The display device may be: a mobile phone, a tablet, a television, a display, a notebook computer, a digital photo frame, a navigator and any other products or parts with display capabilities. For the implementation of the display device, reference may be made to the foregoing embodiment of the flexible display panel, and details will not be described herein again.

Figure 5:
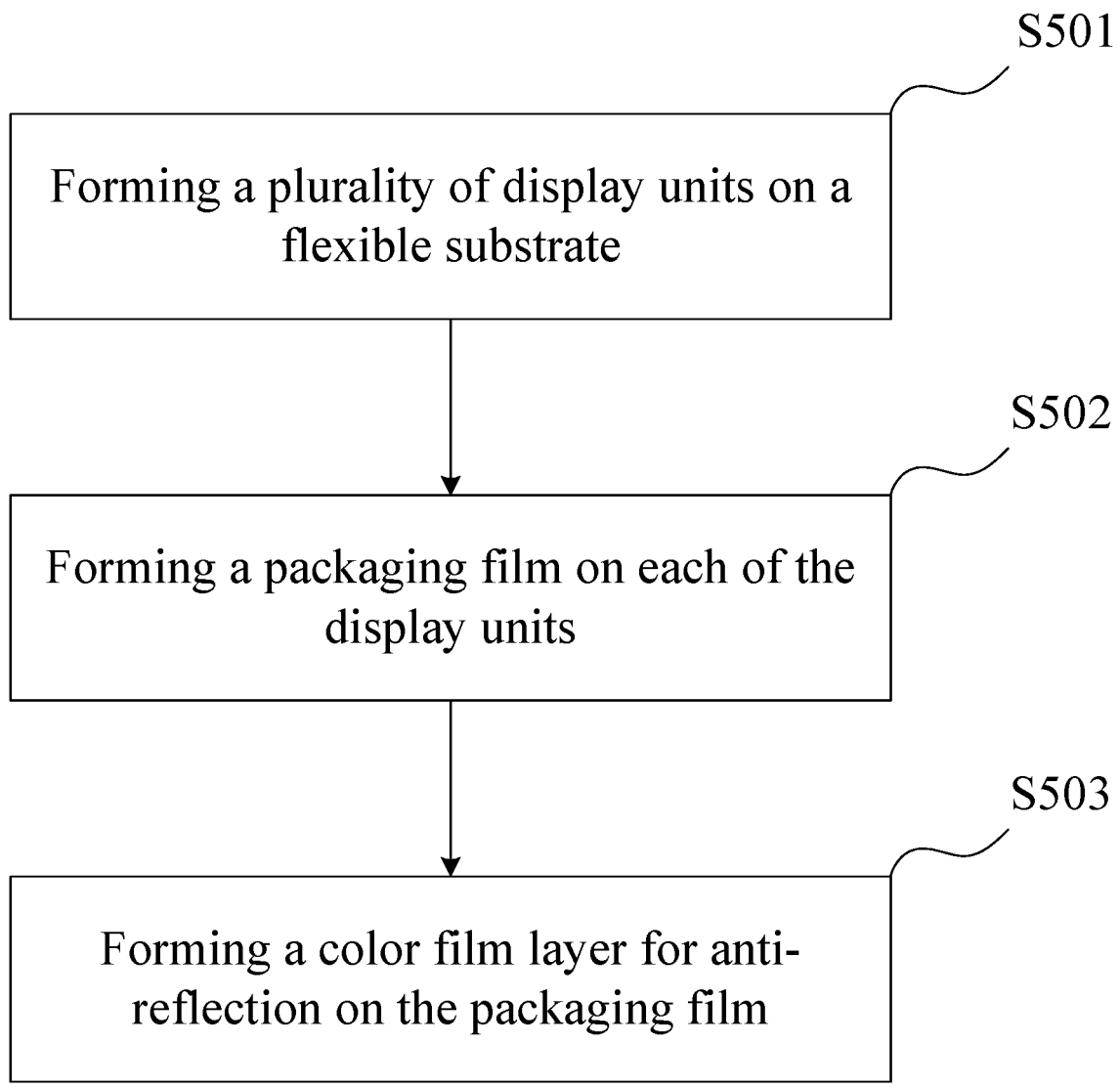
FIG. 5 is a flow chart of a method for manufacturing a flexible display panel provided by an embodiment of the present disclosure.

Based on the same inventive concept, an embodiment of the present disclosure further provides a method for manufacturing the above flexible display panel. As shown in FIG. 5, the method includes following steps.

S501, a plurality of display units are formed on a flexible substrate;

S502, a packaging film is formed on each of the display units; and

S503, a color film layer for anti-reflection is formed on the packaging film, wherein the color film layer includes a plurality of colored light filtering layers provided corresponding to each of the display units and light shielding layers provided at gaps between each of the colored light filtering layers.

Further, in the above manufacturing method provided by the embodiment of the present disclosure, in order to achieve the touch control function, the following steps may be further included: forming a touch detection structure on the packaging film, a pattern of the touch detection structure being located in a region where the light shielding layer is located.

In specific implementation, in the above manufacturing method provided by the embodiments of the present disclosure, the forming a color film layer for anti-reflection and a touch detection structure on the packaging film may be implemented by the following first manner: firstly, a plurality of metal mesh touch detection electrodes is formed on the packaging film; and then the light shielding layer and the color film layer are sequentially formed on each of the metal mesh touch detection electrodes.

Alternatively, in specific implementation, in the above manufacturing method provided by the embodiments of the present disclosure, the forming a color film layer for anti-reflection and a touch detection structure on the packaging film may be implemented by the following second manner: firstly, the light shielding layer and the color film layer are sequentially formed on the packaging film; and then a plurality of metal mesh touch detection electrodes is formed on the light shielding layer.

Alternatively, in specific implementation, in the above manufacturing method provided by the embodiments of the present disclosure, a color film layer for anti-reflection and a touch detection structure on the packaging film can be formed by the following third manner: firstly, a plurality of touch electrodes extending along a first direction are formed on the packaging film; then, the light shielding layer and the color film layer are sequentially formed on each of the touch electrodes extending along the first direction; and finally, a plurality of touch electrodes extending along a second direction are formed on the light shielding layer.

The embodiments of the present disclosure provide a flexible display panel, a manufacturing method thereof and a display device. The flexible display panel includes: a plurality of display units provided on a flexible substrate, a packaging film provided on each of the display units, and an antireflection color film layer f provided on the packaging film, wherein the color film layer includes: a plurality of colored light filtering layers provided corresponding to each of the display units and light shielding layers provided at gaps between each of the colored light filtering layers. By replacing an externally bonded polarizer with a color film layer, the light transmittance of a colored light filtering layer in the color film layer is higher than that of the polarizer, and a light shielding layer in the color film layer may block reflection of a light-reflective element provided at the gap between the display units to the ambient light. In this way, the anti-reflection function may be achieved, and meanwhile it may ensure that the flexible display panel has excellent display brightness. In addition, a thickness of the color film layer is smaller than that of the conventional polarizer, which facilitates bending the flexible display panel.

Those skilled in the art may make various modifications and variations to the present disclosure without departing from the spirit and scope of the present disclosure. In this way, if these modifications and variations of the present disclosure belong to the scope of the claims of the present disclosure and the equivalent technologies, the present disclosure is also intended to include these modifications and variations.

What is claimed is:

1. A flexible display panel, comprising a plurality of display units provided on a flexible substrate, a packaging film provided on each of the display units, and an anti-reflection color film layer provided on the packaging film,
   wherein the anti-reflection color film layer comprises a plurality of colored light filtering layers, and light shielding layers provided at gaps between each of the colored light filtering layers, wherein each of the colored light filtering layers is provided corresponding to each of the display units.

2. The flexible display panel according to claim 1, further comprising: a touch detection structure provided on the packaging film,
   wherein a pattern of the touch detection structure is located in a region where the light shielding layer is located.

3. The flexible display panel according to claim 2, wherein the touch detection structure comprises a plurality of metal mesh touch detection electrodes.

4. The flexible display panel according to claim 3, wherein each of the metal mesh touch detection electrodes is provided in the same layer and arranged in an array.

5. The flexible display panel according to claim 4, wherein each of the metal mesh touch detection electrodes is provided between the light shielding layer and the packaging film; or, each of the metal mesh touch detection electrodes is provided above the light shielding layer.

6. The flexible display panel according to claim 3, wherein each of the metal mesh touch detection electrodes comprises a plurality of touch electrodes extending along a first direction between the light shielding layer and the packaging film, and a plurality of touch electrodes extending along a second direction above the light shielding layer.

7. The flexible display panel according to claim 6, wherein each of the touch detection electrodes extending along the first direction is a touch driving electrode, and each of the touch detection electrodes extending along the second direction is a touch sensing electrode.

8. The flexible display panel according to claim 1, wherein each of the colored light filtering layers comprises a color identical to a color displayed by each of the corresponding display units.

9. The flexible display panel according to claim 8, wherein a shape of each of the colored light filtering layers has a shape identical to a shape of each of the corresponding display units, and an orthographic projection of each of the colored light filtering layers on the packaging film overlap overlaps with and an orthographic projection of each of the corresponding display units on the packaging film.

10. The flexible display panel according to claim 8, wherein each of the display units is repeated by a rhombus constituted by two symmetrical green pentagonal light emitting units, one blue hexagonal light emitting unit and one red hexagonal light emitting unit, wherein an area occupied by the blue hexagonal light emitting unit is larger than an area occupied by the red hexagonal light emitting unit.

11. A display device, comprising the flexible display panel according to claim 1.

12. A method for manufacturing the flexible display panel according to claim 1, comprising:
   forming the plurality of display units on the flexible substrate;
   forming the packaging film on each of the display units; and
   forming the color film layer for anti-reflection on the packaging film, wherein the color film layer comprises the plurality of colored light filtering layers provided corresponding to each of the display units and light shielding layers provided at gaps between each of the colored light filtering layers.

13. The method for manufacturing the flexible display panel according to claim 12, further comprising: forming a touch detection structure on the packaging film, a pattern of the touch detection structure being located in a region where the light shielding layer is located.

14. The method for manufacturing the flexible display panel according to claim 13, wherein the forming a color film layer for anti-reflection and a touch detection structure on the packaging film comprises:
   forming a plurality of metal mesh touch detection electrodes on the packaging film; and sequentially forming the light shielding layer and the color film layer on each of the metal mesh touch detection electrodes.

15. The method for manufacturing the flexible display panel according to claim 13, wherein the forming a color film layer for anti-reflection and a touch detection structure on the packaging film comprises:
   forming a plurality of touch electrodes extending along a first direction on the packaging film;
   sequentially forming the light shielding layer and the color film layer on each of the touch electrodes extending along the first direction; and
   forming a plurality of touch electrodes extending along a second direction on the light shielding layer.

16. The flexible display panel according to claim 6, wherein each of the touch detection electrodes extending along the first direction is a touch sensing electrode, and each of the touch detection electrodes extending along the second direction is a touch driving electrode.

17. The flexible display panel according to claim 2, wherein each of the colored light filtering layers has a color identical to a color displayed by each of the corresponding display units.

18. The display device according to claim 11, wherein the flexible display panel further comprises: a touch detection structure provided on the packaging film, wherein a pattern of the touch detection structure is located in a region where the light shielding layer is located.

19. The method for manufacturing the flexible display panel according to claim 12, wherein the flexible display panel further comprises: a touch detection structure provided on the packaging film,
wherein a pattern of the touch detection structure is located in a region where the light shielding layer is located.

20. The method for manufacturing the flexible display panel according to claim 13, wherein the forming a color film layer for anti-reflection and a touch detection structure on the packaging film comprises: sequentially forming the light shielding layer and the color film layer on the packaging film; and forming a plurality of metal mesh touch detection electrodes on the light shielding layer.

* * * * *